(12) United States Patent
Park et al.

(10) Patent No.: US 8,680,585 B2
(45) Date of Patent: Mar. 25, 2014

(54) LIGHT EMITTING DIODE PACKAGE AND METHOD OF MANUFACTURING THE SAME

(75) Inventors: Young Sam Park, Seoul (KR); Hun Joo Hahm, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 592 days.

(21) Appl. No.: 12/944,401

(22) Filed: Nov. 11, 2010

(65) Prior Publication Data

US 2011/0127558 A1 Jun. 2, 2011

(30) Foreign Application Priority Data

Nov. 27, 2009 (KR) .......................... 10-2009-0115559

(51) Int. Cl.
*H01L 27/148* (2006.01)
(52) U.S. Cl.
USPC .... 257/233; 257/367; 257/676; 257/E25.032; 257/E33.054; 257/E31.105; 438/126; 438/127; 438/237; 438/328
(58) Field of Classification Search
USPC .......... 257/233, 367, 676, E25.032, E33.054, 257/E31.084, E31.105; 438/126, 127, 237, 438/328, FOR. 157, FOR. 287
See application file for complete search history.

(56) References Cited

U.S. PATENT DOCUMENTS

| | | | | |
|---|---|---|---|---|
| 7,115,979 B2* | 10/2006 | Park et al. | ...................... | 257/676 |
| 7,352,011 B2 | 4/2008 | Smits et al. | | |
| 7,473,937 B2* | 1/2009 | Park et al. | ........................ | 257/98 |
| 2005/0263785 A1* | 12/2005 | Kim et al. | ...................... | 257/100 |
| 2005/0280014 A1* | 12/2005 | Park et al. | ........................ | 257/98 |
| 2006/0171151 A1* | 8/2006 | Park et al. | ...................... | 362/327 |
| 2007/0126948 A1* | 6/2007 | Kim et al. | ........................ | 349/61 |
| 2008/0061458 A1* | 3/2008 | Park et al. | .................... | 264/1.32 |
| 2008/0128736 A1* | 6/2008 | Han et al. | ......................... | 257/98 |
| 2008/0254558 A1* | 10/2008 | Han et al. | ........................ | 438/27 |
| 2008/0265269 A1* | 10/2008 | Yoo et al. | ........................ | 257/98 |
| 2009/0321773 A1* | 12/2009 | Park et al. | ........................ | 257/98 |
| 2010/0001306 A1* | 1/2010 | Park et al. | ........................ | 257/99 |

FOREIGN PATENT DOCUMENTS

KR  10-2007-0055152 A  5/2007
KR  10-2009-0047306 A  5/2009

OTHER PUBLICATIONS

Translation of KR 10-2009-0047306 A (included on IDS filed Nov. 11, 2012), Kim et al, Light Emitting Diode package, May 12, 2009, pp. 1-9.*

* cited by examiner

*Primary Examiner* — Alexander Sofocleous
*Assistant Examiner* — Joannie A Garcia
(74) *Attorney, Agent, or Firm* — McDermott Will & Emery LLP (57) ABSTRACT

There is provided a light emitting diode package and a method of manufacturing the same. A light emitting diode package according to an aspect of the invention may include: an LED chip; a body part having the LED chip mounted thereon; a pair of reflective parts extending from the body part to face each other while interposing the LED chip therebetween, and reflecting light emitted from the LED chip; and a molding part provided between the pair of reflective parts to encapsulate the LED chip and having a top surface whose central region is curved inwards.

13 Claims, 9 Drawing Sheets

——— : RELATED ART
—·— : MOLDING PART CONTAINING PHOSPHOR
------ : PHOSPHOR LAYER AROUND LED CHIPS
— — : PHOSPHOR-FREE

LIGHT EMITTING DIODE PACKAGE AND METHOD OF MANUFACTURING THE SAME

CROSS-REFERENCE TO RELATED APPLICATIONS

This application claims the priority of Korean Patent Application No. 10-2009-0115559 filed on Nov. 27, 2009, in the Korean Intellectual Property Office, the disclosure of which is incorporated herein by reference.

BACKGROUND OF THE INVENTION

1. Field of the Invention

The present invention relates to a light emitting diode package and a method of manufacturing the same, and more particularly, to a light emitting diode package that is used as a light source of a backlight unit, and a method of manufacturing the same.

2. Description of the Related Art

Various kinds of thin display devices are currently being used. Liquid crystal displays (LCDs) predominate in these thin display devices.

LCDs are used in various applications ranging from thin wall-mounted TVs to laptop computers to desktop computer monitors to navigation systems to PDAs to cellular phones to game machines. Liquid crystals forming the display devices of these liquid crystal displays do not emit light and merely transmit or block light according to electrical signals being applied.

Therefore, in order to display information on a liquid crystal panel, a surface light-emitting device, a so-called backlight unit needs to be separately provided within a liquid crystal display in order to illuminate the liquid crystal panel from the back. This backlight unit increases brightness and forms uniform surface light sources to evenly illuminate the liquid crystal panel. This is considered very important in terms of product quality.

In general, a backlight unit includes light sources, light guide plates, diffusion sheets, prisms, and a protective sheet. In this backlight unit, light emitting diodes (LEDs) are used as light sources in that LEDs are compact, have a long life span, low operating voltage, and high energy efficiency by directly converting electrical energy into light energy.

A plurality of light emitting diode packages are mounted onto the surface of a printed circuit board (PCB) and are provided at the sides of light guide plates. Light, emitted from each of the light emitting diode packages, is made incident on the light guide plate by total reflection so that light is emitted to a front face.

However, a light emitting diode package according to the related art has a limited orientation angle in both a minor axis direction and a major axis direction due to reflective walls surrounding LED chips.

Therefore, as for a minor axis direction, light leakage occurs, in which light passes over the light guide plate due to a wide orientation angle, thereby reducing uniformity, which is one of the most important properties of the backlight unit. As for a major axis direction, spacing between light sources is reduced due to a narrow orientation angle, which leads to an unnecessary increase in the number of light sources.

SUMMARY OF THE INVENTION

An aspect of the present invention provides a light emitting device package and a method of manufacturing the same that ensures the directionality of light emitted from an LED chip by changing the configuration of a package having the LED chip mounted thereon, and has different orientation angles varying depending on the axial direction by narrowing an orientation angle in a minor axis direction and widening an orientation angle in a major axis direction.

According to an aspect of the present invention, there is provided alight emitting diode package including: an LED chip; a body part having the LED chip mounted thereon; a pair of reflective parts extending from the body part to face each other while interposing the LED chip therebetween, and reflecting light emitted from the LED chip; and a molding part provided between the pair of reflective parts to encapsulate the LED chip and having a top surface whose central region is curved inwards.

The reflective parts may be provided along edges of side surfaces in a major axis direction of the body part longer than those in a minor axis direction thereof.

The molding part may have the top surface whose center crosses perpendicularly to the pair of reflective parts and is depressed to a predetermined depth in parallel with both side surfaces in the minor axis direction of the body part, and form a gentle curve from both side surfaces in the minor axis direction toward the center of the top surface.

The reflective parts each may have a top surface having a shape corresponding to the top surface of the molding part.

The reflective parts each may have a top surface extending upward from the body part to a nadir of the inwardly curved central region.

The reflective parts each may have a top surface extending upward from the body part to both ends of the side surfaces in the major axis direction of the top surface of the molding part.

The molding part may include a phosphor material converting a wavelength of the light emitted from the LED chip.

The light emitting diode package may further include a phosphor layer encompassing the LED chip in order to convert a wavelength of the light emitted from the LED chip.

The molding part may further include a light diffusing agent diffusing the light emitted from the LED chip.

According to another aspect of the present invention, there is provided a method of manufacturing a light emitting diode package, the method including: patterning a metal plate to form a plurality of lead terminals; mounting LED chips on the respective lead terminals and making electrical connections therebetween; forming a body part around each of the lead terminals and forming reflective parts on the body part such that the reflective parts face each other while interposing each of the LED chips; forming a molding part between the reflective parts in order to encapsulate each of the LED chips and each of the lead terminals; forming a nadir on an inwardly curved top surface of the molding part at a position corresponding to each of the LED chips; and performing a dicing operation.

The forming of the reflective parts may include forming a plurality of reflective members along side surfaces in a major axis direction on the body part formed by molding grooves around the patterned lead terminals with resin.

The forming of the nadir on the top surface of the molding part may include pressing a mold formed into a shape corresponding to the nadir.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

A light emitting diode package and a method of manufacturing the same according to exemplary embodiments of the invention will be described with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

A light emitting diode package according to an exemplary embodiment of the invention will be described with reference to FIGS. 1 through 7.

Figure 1:
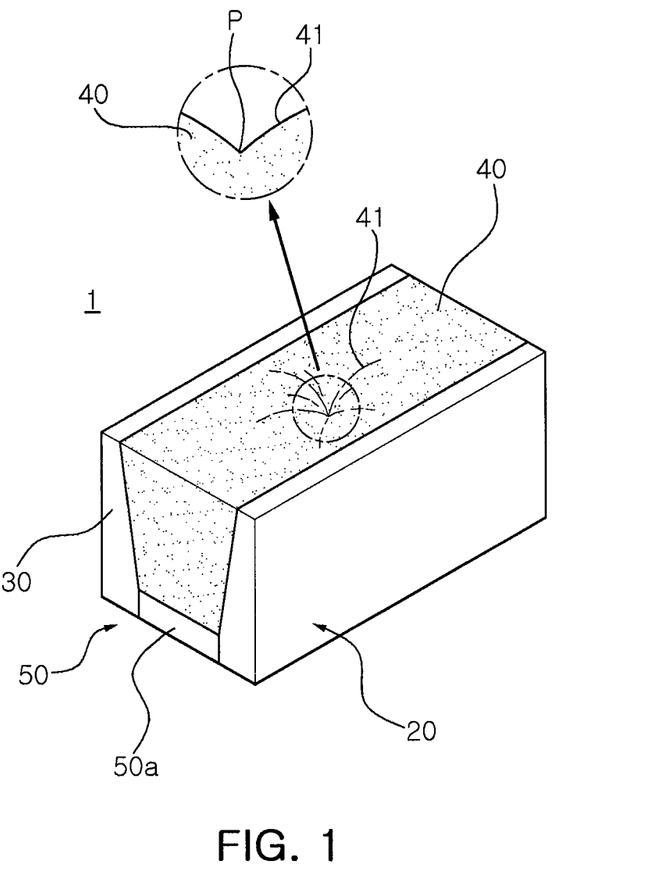
FIG. 1 is a perspective view illustrating a light emitting diode package according to an exemplary embodiment of the present invention.
Figure 2A:
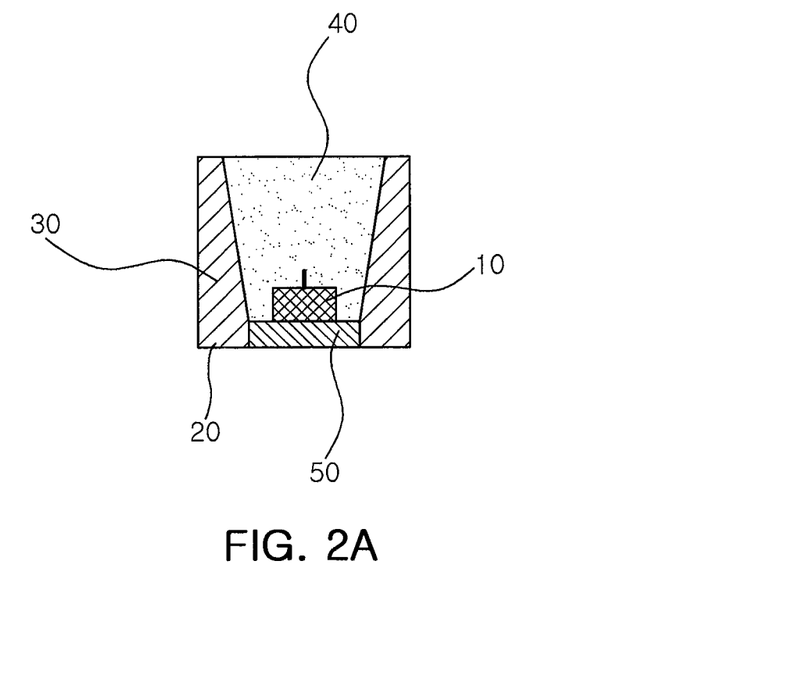
FIG. 2A is a cross-sectional view illustrating a side surface in a minor axis direction of the light emitting diode package of FIG. 1.
Figure 2B:
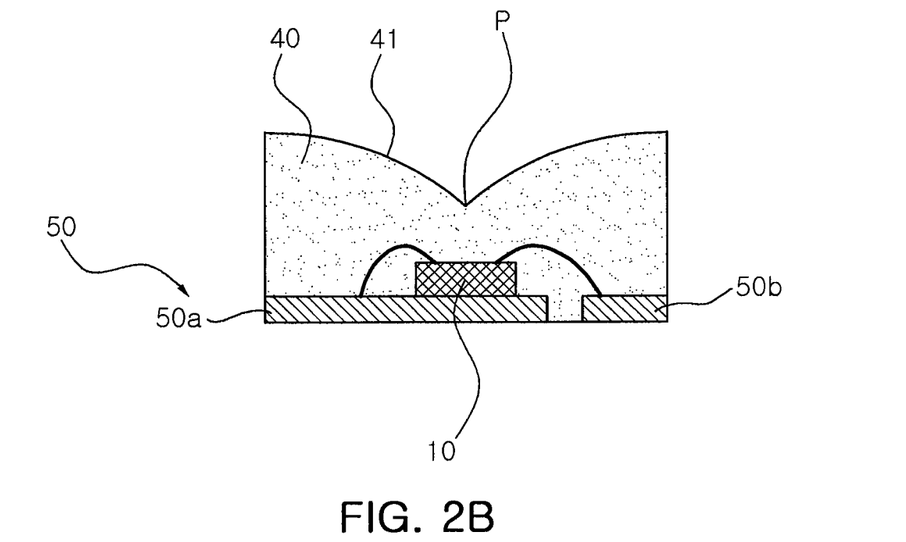
FIG. 2B is a cross-sectional view illustrating a side surface in a major axis direction of the light emitting diode package of FIG. 1.

FIG. 1 is a perspective view illustrating a light emitting diode package according to an exemplary embodiment of the invention. FIG. 2A is a cross-sectional view illustrating a side surface in a minor axis direction of the light emitting diode package, shown in FIG. 1. FIG. 2B is a cross-sectional view illustrating a side surface in a major axis direction of the light emitting diode package, shown in FIG. 1.

Referring to FIGS. 1 and 2, a light emitting diode package 1 according to this embodiment includes an LED chip 10, a body part 20, a pair of reflective parts 30, and a molding part 40.

The LED chip 10 is one type of semiconductor device that emits light having a predetermined wavelength upon receiving power being applied from an external power source. According to this embodiment, a single LED chip 10 is provided. However, the invention is not limited thereto, and a plurality of LED chips may be provided.

The body part 20, on which the LED chip 10 is mounted, may be formed of a synthetic resin or a ceramic material. The body part 20 may include a pair of lead terminals 50 so as to be electrically connected to the LED chip 10.

The pair of lead terminals 50 include a first lead 50a, on which the LED chip 10 is mounted, and a second lead 50b being spaced apart from the first lead 50a. The first lead 50a and the second lead 50b each have a top surface that is exposed to the body part 20 and connected to the LED chip 10. A bottom surface and side surfaces thereof are exposed to the lower surface and side surfaces of the body part 20, respectively, and connected to circuit patterns (not shown) on a substrate (not shown) on which the light emitting diode package 1 is mounted.

In this case, heat, generated from the LED chip 10, is directly discharged to the outside from the body part 20 through the lead terminals 50, thereby increasing heat dissipation efficiency. In particular, with an increase in the lead terminals 50 being exposed to the outside of the body part 20, heat dissipation efficiency can be further increased.

In FIGS. 1 and 2A and 2B, the LED chip 10, which is mounted on the first lead 50a through an adhesive (not shown), is connected to the first lead 50a and the second lead 50b by wires, that is, a two-tap wire structure is illustrated. However, the invention is not limited thereto, and a one-tap wire structure may be used. That is, while the LED chip 10 may be mounted on the first lead 50a, the LED chip 10 may be connected to the second lead 50b by a wire.

According to the characteristics and processing conditions of the LED chip 10, the LED chip 10 may be connected using solder bumps by a flip-chip bonding method.

The reflective parts 30 extend from the body part 20 to face each other on the basis of the LED chip 10 in order to reflect light emitted from the LED chip 10.

The reflective parts 30 may be formed integrally with the body part 20 during the injection molding of the body part 20 or may be bonded to the body part 20. The pair of reflective parts 30 are parallel to each other.

In particular, like this embodiment, when the body part 20 has a rectangular cross-section in which each side has a greater length than that of the side perpendicular to it, the reflective parts 30 are provided along the edges of the side surfaces of the body part 20 in a major axis direction than the side surfaces thereof in a minor axis direction.

The reflective parts 30 are provided along the side surfaces of the body part 20 in the major axis direction rather than along the side surfaces thereof in the minor axis direction, thereby increasing an orientation angle in the major axis direction. An orientation angle in the minor axis direction can be controlled according to the lengths of the reflective parts 30 and the inclined surfaces inside the reflective parts.

The molding part 40 is formed on the body part 20, on which the LED chip 10 is mounted, and located between the pair of reflective parts 30 in order to encapsulate the LED chip 10 and the first and second leads 50a 50b.

The molding part 40 may be formed of a transparent resin in order to transmit light, emitted from the LED chip 10, to the outside.

In particular, the molding part 40 has a top surface 41 whose center is curved inwards at a position corresponding to the LED chip 10. The top surface 41 is inclined and depressed (a funnel shape) while forming a gentle curve from both ends of the side surfaces in the major axis direction toward a nadir P at the center thereof. Therefore, as shown in FIG. 2B, the top surface 41 of the molding part 40 has a symmetrical shape on the basis of the nadir P at the center in the same optical axis as that of the LED chip 10.

Through this structure, light, emitted from the LED chip 10, is transmitted through the molding part 40 toward the top surface (front surface), while the light, emitted from the LED chip 10, is totally reflected by the top surface 41, which forms a curved surface toward the side surfaces in the minor axis direction of the molding part 40, so as to be emitted to the side surfaces in the minor axis direction.

In particular, unlike the related art, since the reflective parts 30 are not provided on the side surfaces in the minor axis direction, light, totally reflected toward the side surfaces in the minor axis direction, can be emitted without being reflected by the reflective parts 30, thereby improving light directivity.

The molding part 40 may contain a phosphor material converting the wavelength of the light, emitted from the LED chip 10, and may further contain a light diffusing agent that diffuses light emitted from the LED chip 10.

Figure 3A:
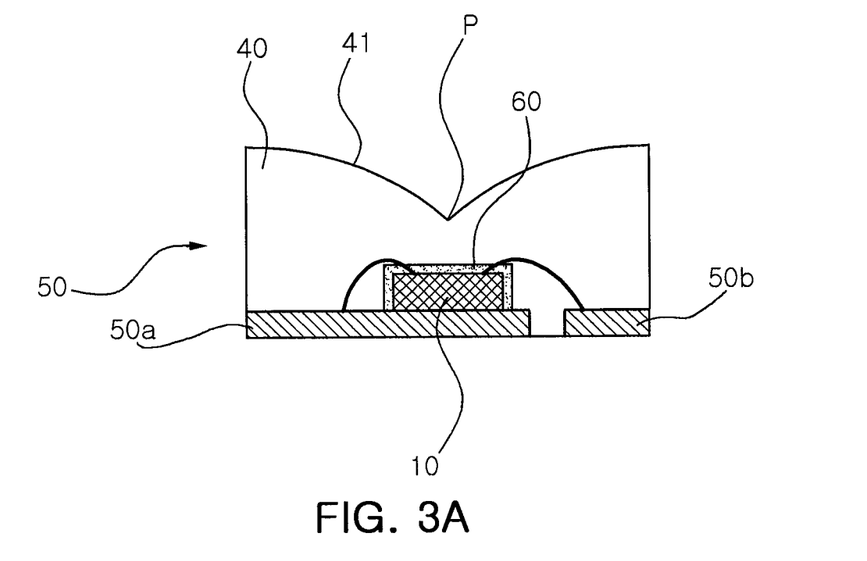
FIGS. 3A and 3B are cross-sectional views illustrating modifications of the light emitting diode package of FIG. 1.

Furthermore, as shown in FIG. 3A, a phosphor layer 60 surrounding the LED chip 10 may be provided to convert the wavelength of the light emitted from the LED chip 10. Here, the molding part 40 maybe formed of a transparent resin or contain a light diffusing agent instead of the phosphor material.

The phosphor layer 60 may be formed on the surface of the LED chip 10 by coating or deposition or may be bonded in the form of a layer. Alternatively, the phosphor layer 60 may be formed separated at a predetermined interval from the LED chip 10 to encompass the LED chip 10.

Figure 3B:
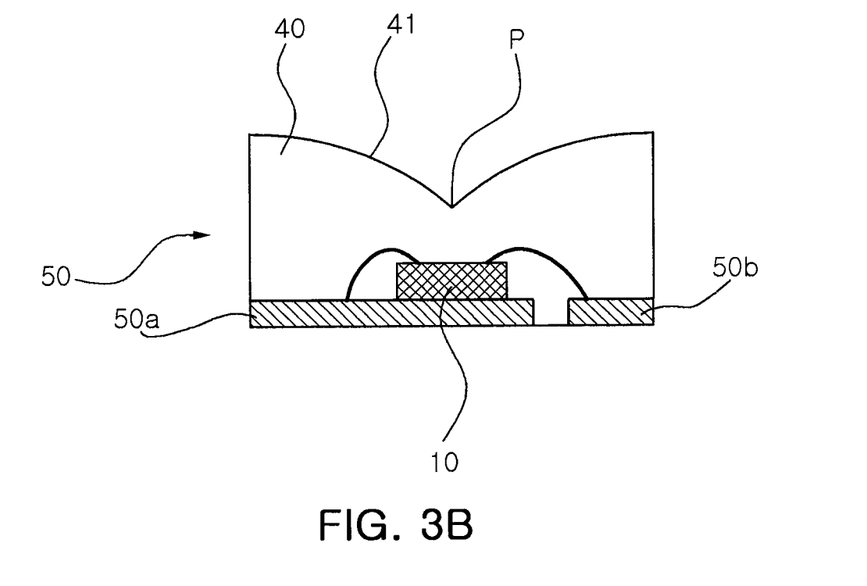

Furthermore, as shown in FIG. 3B, the molding part 40 may contain only the light diffusing agent instead of the phosphor material.

Figure 4:
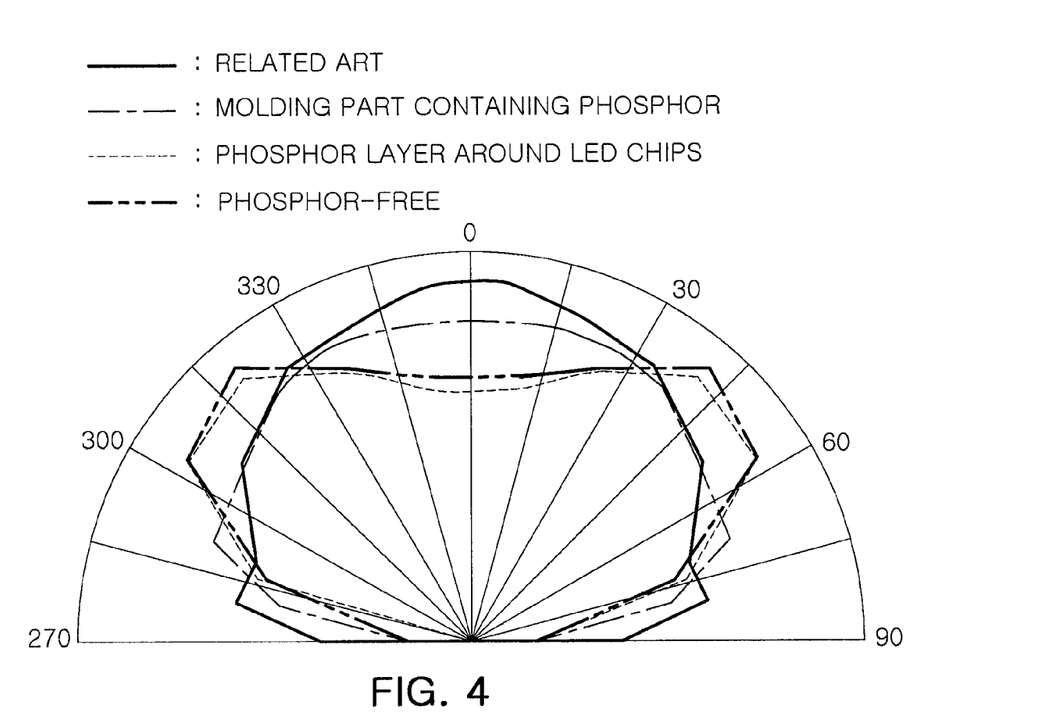
FIG. 4 is a graph illustrating the distribution of an orientation angle.

FIG. 4 is a graph illustrating a comparison in the distribution of an orientation angle between a light emitting diode package according to the related art and a light emitting diode package according to an exemplary embodiment of the invention.

As for a light emitting diode package according to the related art, it can be seen that light is distributed within a limited range due to a small orientation angle in a major axis direction. On the other hand, as for a light emitting diode package according to an exemplary embodiment of the invention, an orientation angle in a major axis direction is widened as compared with that of the light emitting diode package according to the related art. As a result, it can be seen that light is distributed in a wider range toward the sides.

In this case, the spacing between light sources can be increased, and thus the number of light emitting diode packages being mounted can be reduced, thereby reducing manufacturing costs and achieving miniaturization.

Light emitting diode packages 1-1, 1-2, and 1-3 according to other embodiments of the invention will be described with reference to FIGS. 5 through 7.

Figure 5:
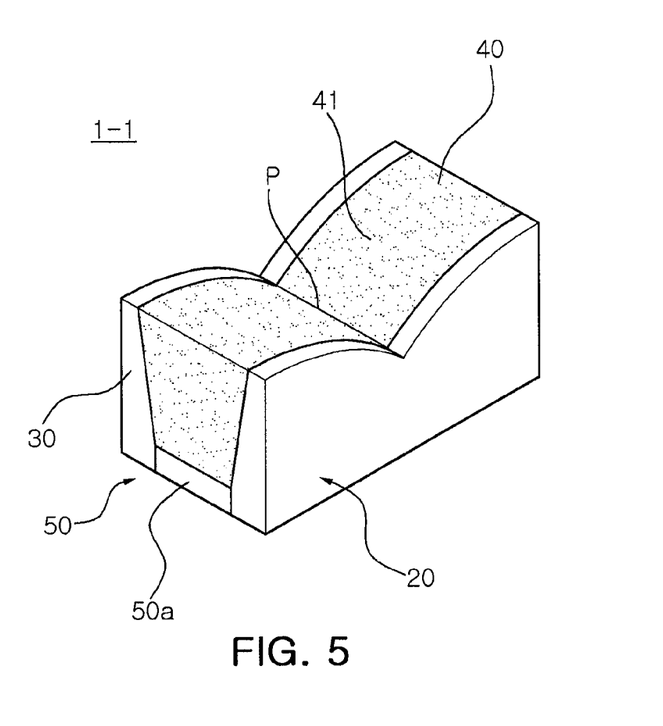
FIGS. 5 through 7 are perspective views illustrating different embodiments of the light emitting diode package of FIG. 1.

As shown in FIG. 5, a light emitting diode package 1-1 may include the molding part 40 whose top surface has a center perpendicularly crossing the pair of reflective parts 30. The center is depressed to a predetermined depth in parallel with the side surfaces in the minor axis direction of the body part 20. That is, the top surface 41 is depressed while forming a gentle curve toward the nadir P, which is the center of the top surface, from the side surfaces in the minor axis direction.

Here, the top surface of each of the reflective parts 30 may have a shape corresponding to the top surface 41 of the molding part 40.

Figure 6:
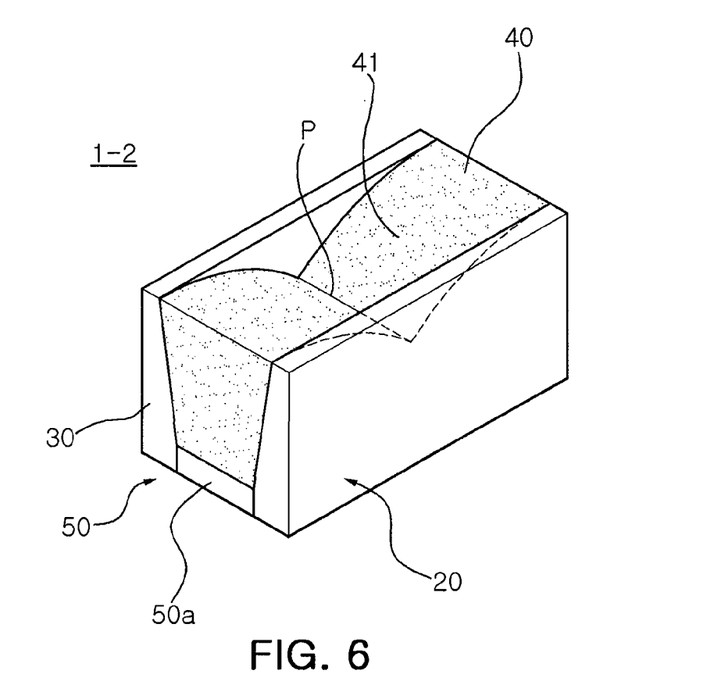

Furthermore, as shown in FIG. 6, a light emitting diode package 1-2 may have top surfaces of the reflective parts 30 that extend upwards from the body part 20 to both ends of the side surfaces in the major axis direction of the top surface 41 of the molding part 40.

Figure 7:
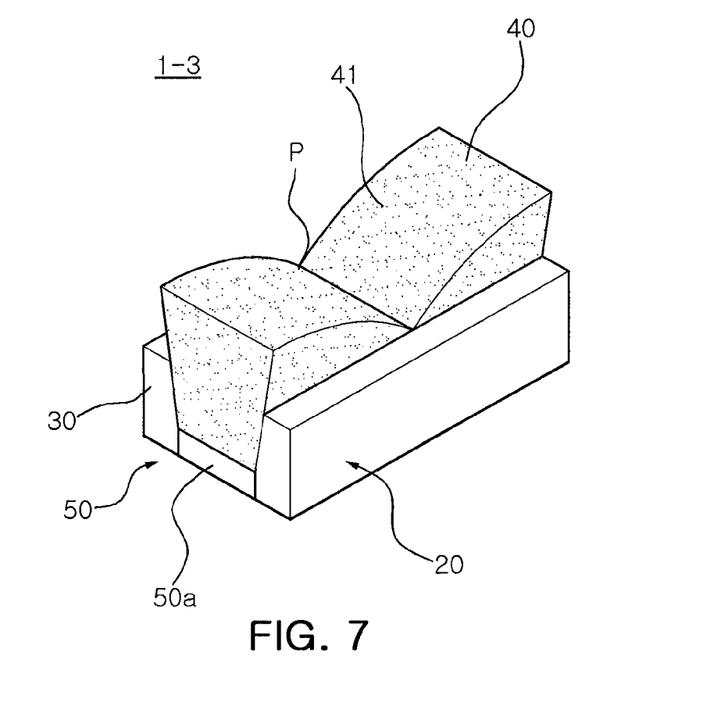

Furthermore, as shown in FIG. 7, a light emitting diode package 1-3 may have top surfaces of the reflective part 30 that extend upwards from the body part 20 to the nadir P of the inwardly curved top surface 41 of the molding part 40.

A method of manufacturing a light emitting diode package according to an exemplary embodiment of the invention will now be described with reference to FIGS. 8 through 13.

FIGS. 8 through 13 are perspective views illustrating the process flow of a method of manufacturing a light emitting diode package according to an exemplary embodiment of the invention.

Figure 8:
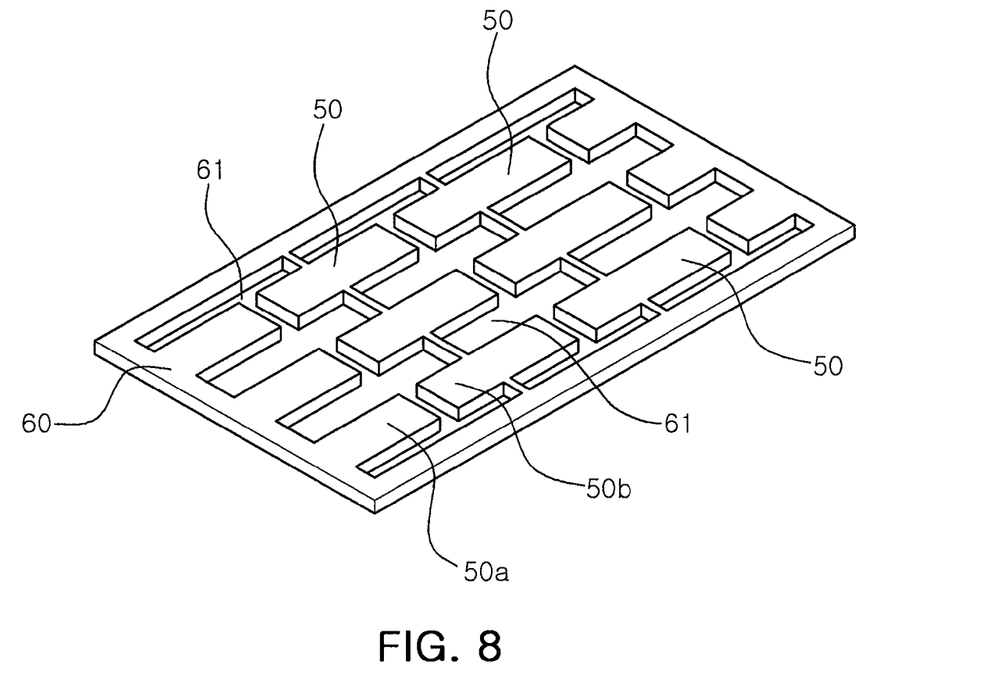
FIGS. 8 through 13 are perspective views illustrating the process flow of a method of manufacturing a light emitting diode package according to an exemplary embodiment of the present invention.

First, as shown in FIG. 8, a metal plate 60 is patterned to provide a plurality of lead terminals 50.

The metal plate 60 may be formed of a metal having excellent electrical conductivity and thermal conductivity. The lead terminals 50 may be provided by repetitively patterning the first lead 50a and the second lead 50b, which is separated from the first lead 50a.

Here, grooves 61 maybe formed around the lead terminals 50 by patterning.

Figure 9:
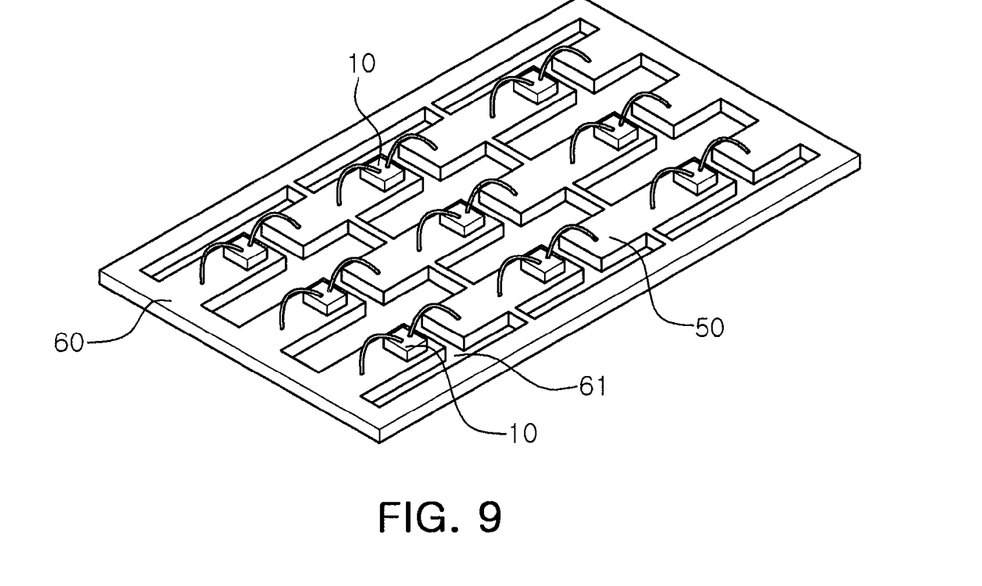

Then, as shown in FIG. 9, the LED chips 10 are mounted on the respective lead terminals 50, and are electrically connected to the lead terminals 50 by wire bonding.

Figure 10:
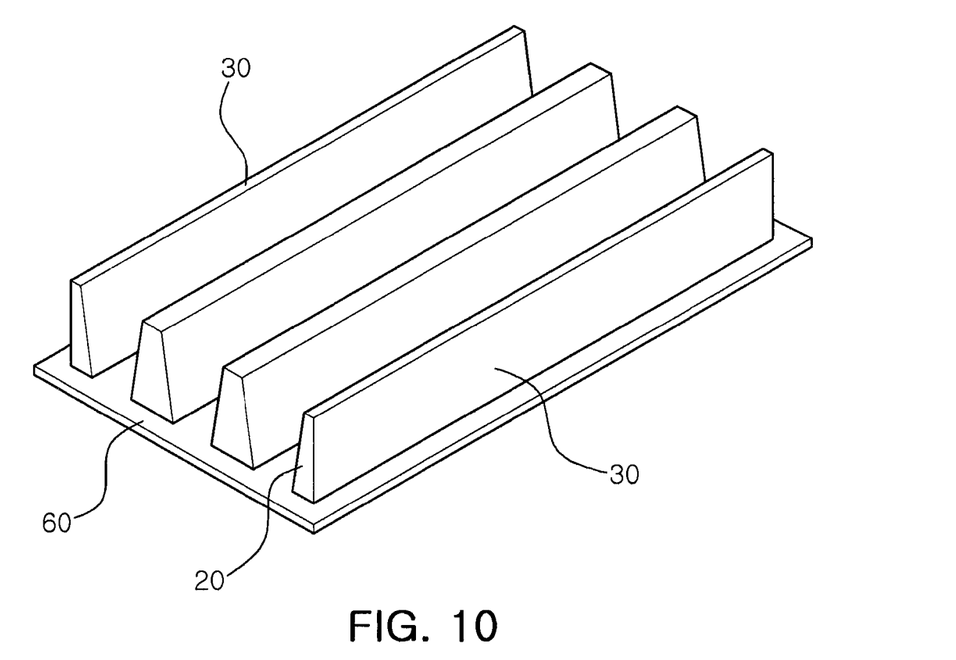

Then, as shown in FIG. 10, body parts 20 are provided around the respective lead terminals 50, and reflective parts 30 facing each other while interposing each of the LED chips 10 are provided on each of the body parts 20.

Here, the body part 20 is formed by molding the grooves 61 around the lead terminals 50 with resin or the like while exposing the top and bottom surfaces of the lead terminals 50.

A plurality of reflective parts 30 facing each other are provided on the body parts 20 along the side surfaces in the major axis direction thereof.

Figure 11:
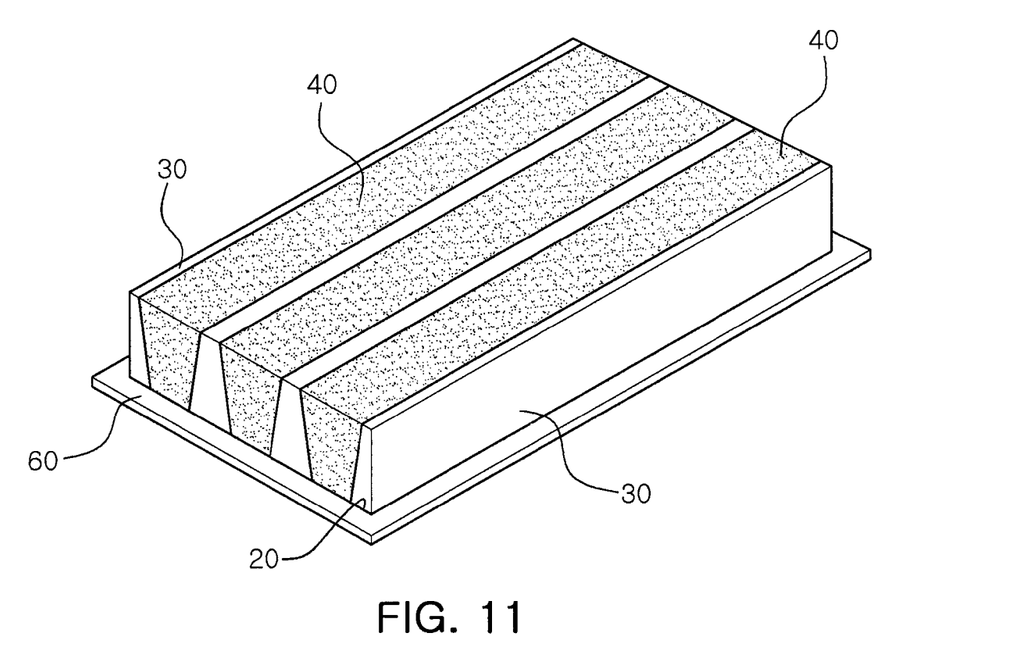
Figure 12:
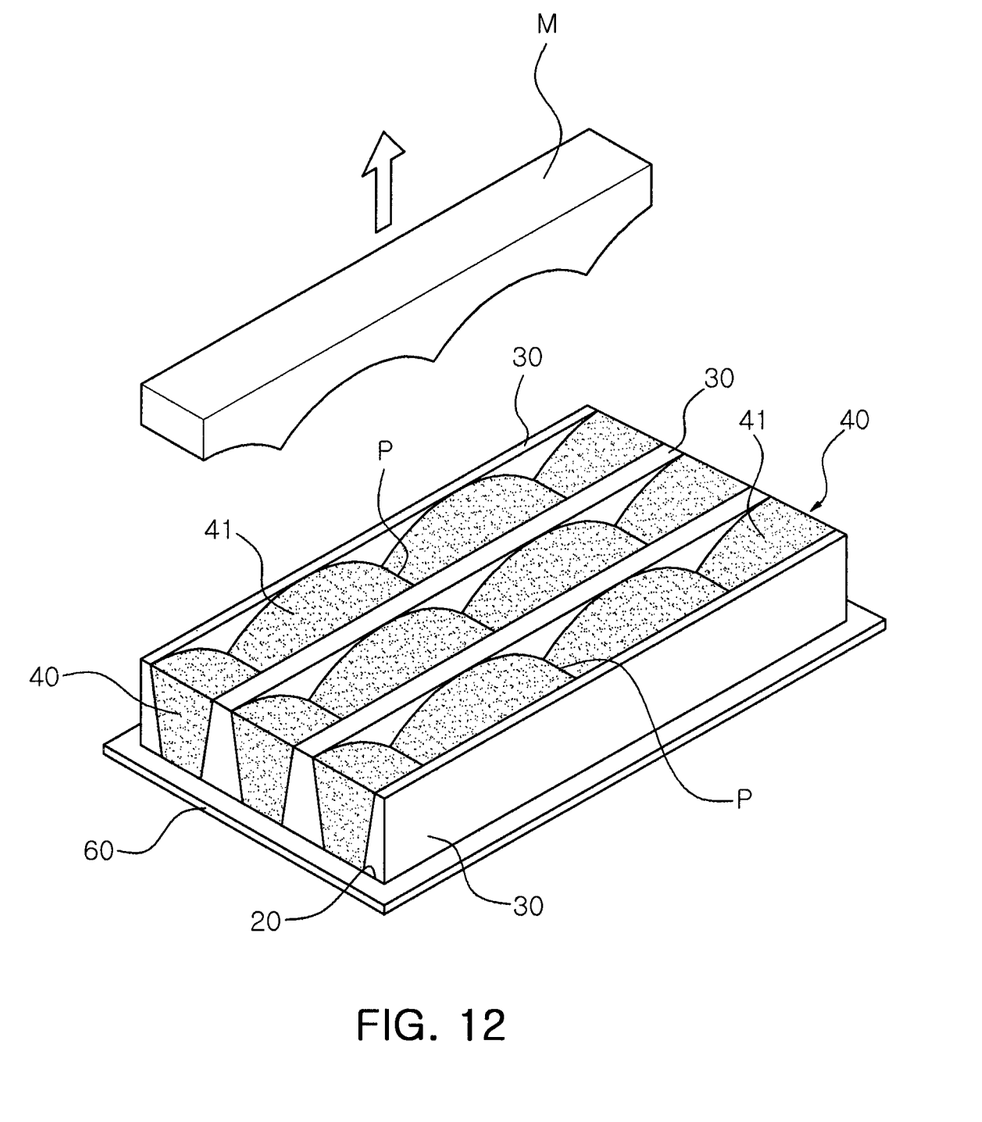

Then, as shown in FIGS. 11 and 12, the molding part 40 is formed between the reflective parts 30 in order to encapsulate the top surfaces of each of the LED chips 10 and each of the lead terminals 50.

The, the nadir P is inwardly curved into each of the top surfaces 41 of the molding part 40 at a position corresponding to the LED chip 10 such that the nadir P is located at an direct upper part of the LED chip 10.

Figure 13:
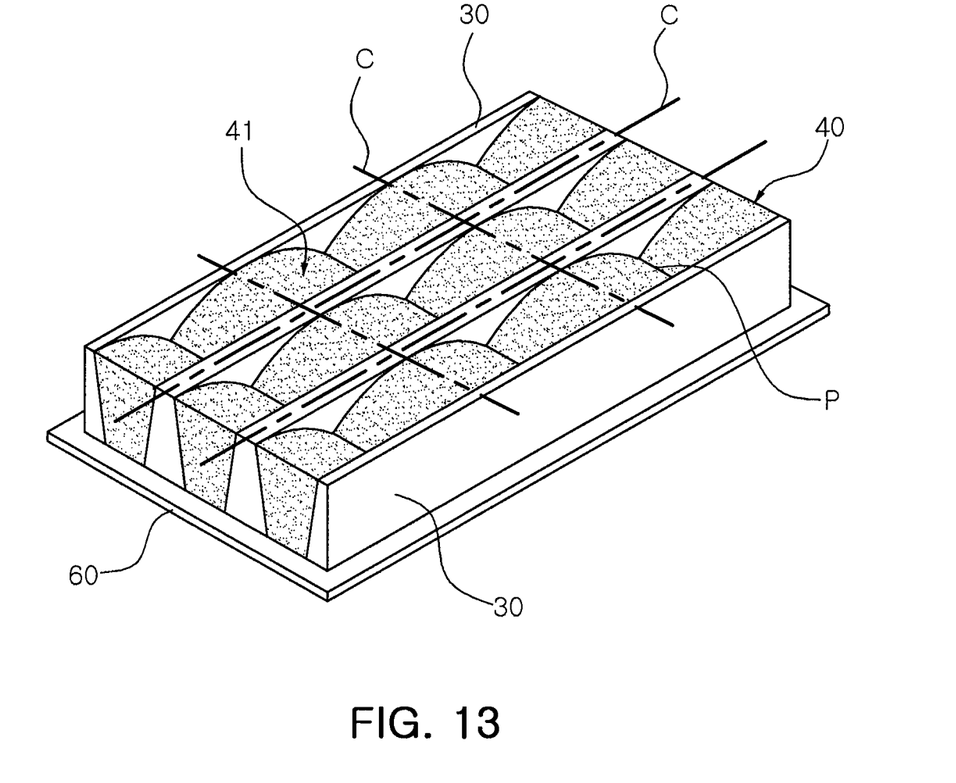

Then, as shown in FIG. 13, a dicing operation is performed along cutting lines to thereby manufacture a plurality of light emitting diode packages.

As described above, the light emitting diode package according to the exemplary embodiment of the invention can remarkably increase an orientation angle in a major axis direction since reflective parts are not provided on side surfaces in a minor axis direction. Furthermore, as a central region of a top surface of a molding part, which encapsulates the LED chip, is depressed to a predetermined depth toward the LED chip, the molding part has a symmetrical structure, so that light, emitted from the LED chip, can be radiated toward both side surfaces in a minor axis direction.

As set forth above, according to exemplary embodiments of the invention, the directionality of light emitted from an LED chip is improved by narrowing an orientation angle in a minor axis direction, and light leakage in which light passes over a light guide plate is prevented to thereby improve the luminance uniformity of a backlight unit.

Furthermore, the number of light emitting diode packages being mounted can be reduced by increasing an orientation angle in a major axis direction to thereby achieve miniaturization, simplify manufacturing processes and reduce manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode package, comprising:
an LED chip;
a body part having the LED chip mounted thereon;

a pair of reflective parts, extending from the body part to face each other while interposing the LED chip therebetween, and reflecting light emitted from the LED chip; and a molding part disposed between the pair of reflective parts to encapsulate the LED chip and having a top surface whose central region is curved inwards such that the central region of the top surface of the molding part partially reflects the light emitted from the LED chip toward side surfaces of the molding part that are perpendicular to the reflective parts.

2. The light emitting diode package of claim 1, wherein:
the reflective parts are disposed along edges of side surfaces of the body part extending in a major axis direction, and
the edges of the side surfaces of the body part extending in the major axis direction are longer than edges of side surfaces of the body part extending in a minor axis direction.

3. The light emitting diode package of claim 1, wherein:
the central region of the top surface of the molding part crosses perpendicularly to the pair of reflective parts in parallel with side surfaces of the body part extending in a minor axis direction, and
the central region of the top surface of the molding part is depressed in a depth direction such that a gentle curve extends from both of the side surfaces of the body part in the minor axis direction toward the central region of the top surface of the molding part.

4. The light emitting diode package of claim 1, wherein the reflective parts each have a top surface having a shape corresponding to the top surface of the molding part.

5. The light emitting diode package of claim 1, wherein the reflective parts each have a top surface extending upward from the body part to a nadir of the inwardly curved central region.

6. The light emitting diode package of claim 1, wherein the reflective parts each have a top surface extending upward from the body part to both ends of the top surface of the molding part in a major axis direction.

7. The light emitting diode package of claim 1, wherein the molding part comprises a phosphor material converting a wavelength of the light emitted from the LED chip.

8. The light emitting diode package of claim 1, further comprising a phosphor layer encompassing the LED chip in order to convert a wavelength of the light emitted from the LED chip.

9. The light emitting diode package of claim 1, wherein the molding part further comprises a light diffusing agent diffusing the light emitted from the LED chip.

10. The light emitting diode package of claim 1, wherein:
the body part includes lead terminals having a top surface, a bottom surface and side surfaces,
the top surface of the lead terminals is exposed to the body part and connected to the LED chip,
the bottom surface and side surfaces of the lead terminals are exposed to a lower surface and side surfaces of the body part, respectively.

11. A method of manufacturing a light emitting diode package, the method comprising:
patterning a metal plate to form a plurality of lead terminals;
mounting LED chips on the respective lead terminals and making electrical connections therebetween;
forming a body part around each of the lead terminals and forming reflective parts on the body part such that the reflective parts face each other while interposing each of the LED chips;
forming a molding part between the reflective parts to encapsulate each of the LED chips and each of the lead terminals;
forming an inwardly curved nadir on a top surface of the molding part at a position corresponding to each of the LED chips such that when light is emitted from each of the LED chips, the inwardly curved nadir partially reflects the emitted light toward side surfaces of the molding part that are perpendicular to the reflective parts; and
performing a dicing operation.

12. The method of claim 11, wherein the forming of the reflective parts comprises forming a plurality of reflective members along side surfaces of the body part extending in a major axis direction by molding grooves around the patterned lead terminals with resin.

13. The method of claim 11, wherein the forming of the nadir on the top surface of the molding part comprises pressing a mold formed into a shape corresponding to the nadir.

* * * * *